US012772723B2

(12) United States Patent
Kim et al.

(10) Patent No.: US 12,772,723 B2
(45) Date of Patent: Oct. 20, 2026

(54) DISPLAY APPARATUS

(71) Applicant: LG Display Co., Ltd., Seoul (KR)

(72) Inventors: Hyun Kim, Paju-si (KR); HyunTaek Lim, Paju-si (KR); KyooHo Lee, Paju-si (KR); SangMo Byun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 1314 days.

(21) Appl. No.: 17/563,740

(22) Filed: Dec. 28, 2021

(65) Prior Publication Data

US 2022/0209185 A1 Jun. 30, 2022

(30) Foreign Application Priority Data

Dec. 31, 2020 (KR) ........................ 10-2020-0189863

(51) Int. Cl.

*H10K 77/10* (2023.01)
*H10K 50/84* (2023.01)
*H10K 50/842* (2023.01)
*H10K 50/844* (2023.01)
*H10K 50/86* (2023.01)
*H10K 59/12* (2023.01)
*H10K 59/80* (2023.01)

(52) U.S. Cl.

CPC ........... *H10K 77/10* (2023.02); *H10K 59/871* (2023.02); *H10K 59/873* (2023.02); *H10K 59/12* (2023.02); *H10K 59/874* (2023.02)

(58) Field of Classification Search

CPC .. H10K 59/874; H10K 59/871; H10K 59/873; H10K 77/10

See application file for complete search history.

(56) References Cited

U.S. PATENT DOCUMENTS 9,966,558 B2 5/2018 Kim
2014/0252386 A1* 9/2014 Ito ........................ H10K 59/871 438/26
2015/0048331 A1 2/2015 Kwack et al.
2017/0155086 A1* 6/2017 Kang .................. H10K 59/871

FOREIGN PATENT DOCUMENTS

KR 10-2015-0019717 A 2/2015
KR 10-2016-0116240 A 10/2016
KR 10-2017-0051600 A 5/2017
KR 10-2018-0062155 A 6/2018
KR 20200051954 A * 5/2020 ......... H01L 51/5259

OTHER PUBLICATIONS

Office Action dated May 29, 2024 issued in corresponding Korean Patent Application No. 10-2020-0189863.

* cited by examiner

*Primary Examiner* — Antonio B Crite

(74) *Attorney, Agent, or Firm* — Morgan, Lewis & Bockius LLP

(57) ABSTRACT

A display apparatus may include a first substrate including a display area and a non-display area surrounding the display area, the first substrate having at least one concave portion recessed into the first substrate in the non-display area; an encapsulation layer on the first substrate and disposed in the at least one concave portion; and a second substrate on the encapsulation layer and overlapping the first substrate.

13 Claims, 9 Drawing Sheets

I-I'

DISPLAY APPARATUS

CROSS-REFERENCE TO RELATED APPLICATION

This application claims the benefit of and the priority to Korean Patent Application No. 10-2020-0189863 filed on Dec. 31, 2020, which is hereby incorporated by reference as if fully set forth herein.

BACKGROUND

1. Technical Field

The present disclosure relates to a display apparatus and, more particularly, to a display apparatus for delaying and preventing the penetration of external gas or moisture into the display apparatus.

2. Discussion of the Related Art

Recently, flat panel display apparatuses having beneficial characteristics, such as thinness, lightness, and low power consumption, have been widely developed and are being applied to various fields.

In such flat panel display apparatuses, electroluminescent display apparatuses are apparatuses where an electric charge is injected into a light emitting layer formed between a cathode (or an electron injection electrode) and an anode (or a hole injection electrode). Thus, an exciton is generated by a combination of an electron and a hole, thereby emitting light based on a radiative recombination of the exciton.

The electroluminescent display apparatuses may be provided on a flexible substrate, such as plastic, and may self-emit light. Thus, these display apparatuses may have a high contrast ratio and a response time of several microseconds (μs). Therefore, compared to other types of display apparatuses, the electroluminescent display apparatuses may more easily implement a moving image, may not be as limited in viewing angle, may be relatively stable in low temperature, and may be driven with a relatively low voltage. Thus, a driving circuit may be easily manufactured and designed.

In such electroluminescent display apparatuses, electrodes and the light emitting layer may be degraded by oxygen. A degradation caused by an internal factor, such as a reaction between the light emitting layer and an interface, may occur. Also, a degradation may occur readily due to external causes, such as external moisture, external oxygen, external gas, ultraviolet light, and a manufacturing condition of each element. Particularly, external oxygen and water (or moisture) may have a fatal effect on the lifetime of devices. Thus, encapsulation technology for maintaining the reliability of display apparatuses is needed.

SUMMARY

Accordingly, embodiments of the present disclosure are directed to a display apparatus that substantially obviates one or more problems due to limitations and disadvantages of the related art.

An aspect of the present disclosure is directed to providing a display apparatus which is capable of preventing or delaying the penetration of external gas or moisture into the display apparatus, has enhanced reliability against the penetration of external gas or moisture, and has an increased lifetime.

Additional features and aspects will be set forth in part in the description that follows, and in part will become apparent from the description, or may be learned by practice of the inventive concepts provided herein. Other features and aspects of the inventive concepts may be realized and attained by the structure particularly pointed out in, or derivable from, the written description, the claims hereof, and the appended drawings.

To achieve these and other aspect of the inventive concepts, as embodied and broadly described herein, a display apparatus may include: a first substrate including a display area and a non-display area surrounding the display area, the first substrate having at least one concave portion recessed into the first substrate in the non-display area; an encapsulation layer on the first substrate and disposed in the at least one concave portion; and a second substrate on the encapsulation layer and overlapping the first substrate.

In another aspect, display apparatus may include: a first substrate including a display area and a non-display area surrounding the display area; at least one protrusion member on the first substrate in the non-display area; an encapsulation layer on the first substrate and on the at least one protrusion member, the encapsulation layer being adhered to the at least one protrusion member; and a second substrate on the encapsulation layer and overlapping the first substrate, wherein the at least one protrusion member is between the first substrate and the second substrate and protrudes toward the second substrate.

In yet another aspect, a display apparatus may include: a first substrate including a display area and a non-display area surrounding the display area; an encapsulation layer on the first substrate and having at least one protrusion portion in the non-display area; and a second substrate on the encapsulation layer and overlapping the first substrate, wherein the at least one protrusion portion of the encapsulation layer is between the first substrate and the second substrate and protrudes away from the second substrate.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Figure 1:
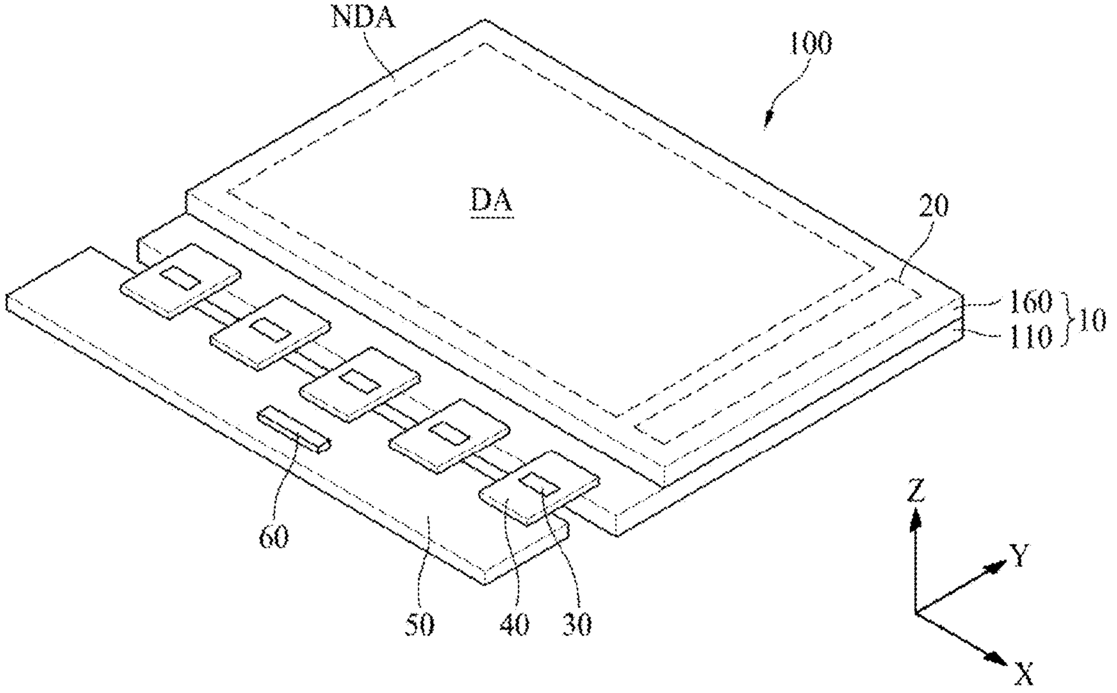
FIG. 1 illustrates a perspective view of a display apparatus according to an example embodiment of the present disclosure.

Reference will now be made in detail to embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. The same or similar elements are designated by the same reference numerals throughout the specification unless otherwise specified.

In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," and the like may be used herein to describe various elements, the elements should not be limited by these terms. These terms are used only to identify one element from another. For example, a first element could be termed a second element, and similarly, a second element could be termed a first element, without departing from the scope of the present disclosure.

Although the terms "first," "second," A, B, (a), (b), and the like may be used herein to describe various elements, the elements should not be interpreted to be limited by these terms as they are not used to define a particular order, precedence, or number of the corresponding elements. These terms are used only to identify one element from another.

The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, example embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale in which each of elements is illustrated in the accompanying drawings may differ from an actual scale. Thus, the illustrated elements are not limited to the specific scale in which they are illustrated in the drawings.

FIG. 1 illustrates a perspective view of a display apparatus 100 according to an example embodiment of the present disclosure.

As illustrated in FIG. 1, the display apparatus 100 according to an example embodiment of the present disclosure may include a display panel 10, a gate driver 20, a source driver 30, a flexible film 40, a circuit board 50, and a controller 60.

The display panel 10 may include a first substrate 110 and a second substrate 160. The first substrate 110 may be a pixel array substrate, and the second substrate 160 may be a color filter substrate or an encapsulation layer or substrate. A plurality of gate lines, a plurality of data lines, and a plurality of pixels may be provided on one surface of the first substrate 110 facing the second substrate 160. The pixels may be respectively provided in a plurality of pixel areas defined by intersections between the gate lines and the data lines. According to some example embodiments of the present disclosure, each of the first substrate 110 and the second substrate 160 of the display panel 10 may be prepared through a separate process. Then, the first substrate 110 may be bonded to the second substrate 160. However, embodiments of the present disclosure are not limited to such examples.

Each of the pixels may include a thin film transistor (TFT) and an organic light emitting device having an anode electrode, an organic light emitting layer, and a cathode electrode. When a gate signal is applied through a gate line, each of the pixels connected to the gate line may supply a certain current via the TFT to the organic light emitting device based on a data voltage of a data line. Accordingly, the organic light emitting device of each of the pixels may emit light having certain brightness based on a certain current. An example structure of each of the pixels will be described below in more detail with reference to FIGS. 4A and 4B.

The display panel 10, as shown in FIG. 1, may be divided into a display area DA where the pixels are provided to display an image and a non-display area NDA not configured to display an image. The gate lines, the data lines, and the pixels may be provided in the display area DA. The gate driver 20 and a plurality of pads may be provided in the non-display area NDA.

The gate driver 20 may supply gate signals to the gate lines based on a gate control signal input from the controller 60. The gate driver 20 may be provided as a gate driver in panel (GIP) type in the non-display area NDA adjacent to one side or both sides of the display area DA of the display panel 10. Alternatively, the gate driver 20 may be provided as a driving chip and may be mounted on a flexible film. As another alternative, the gate driver 20 may be attached as a tape automated bonding (TAB) type in the non-display area NDA next to one side or both sides of the display area DA of the display panel 10.

The source driver 30 may receive digital video data and a source control signal from the controller 60. The source driver 30 may convert the digital video data into analog data voltages based on the source control signal and may supply the analog data voltages to the data lines. In a case where the source driver 30 is provided as a driving chip, the source driver 30 may be mounted on the flexible film 40 in a chip on film (COF) type or a chip on plastic (COP) type.

A plurality of pads, such as a plurality of data pads, may be provided in the non-display area NDA of the display panel 10. A plurality of lines connecting the pads to the source driver 30 and a plurality of lines connecting the pads to the circuit board 50 may be provided in the flexible film 40. The flexible film 40 may be attached on the pads by using an anisotropic conductive film. Thus, the pads may be connected to the lines of the flexible film 40.

The circuit board 50 may be attached to a plurality of flexible films 40. A plurality of circuits implemented as driving chips may be mounted on the circuit board 50. For example, the controller 60 may be mounted on the circuit board 50. The circuit board 50 may be a printed circuit board (PCB) or a flexible PCB (FPCB).

The controller 60 may receive the digital video data and a timing signal from an external system board through a cable of the circuit board 50. The controller 60 may generate the gate control signal for controlling an operation timing of the gate driver 20 and the source control signal for controlling a plurality of source drivers 30, based on the timing signal. The controller 60 may supply the gate control signal to the gate driver 20 and may supply the source control signal to the source drivers 30.

Figure 2:
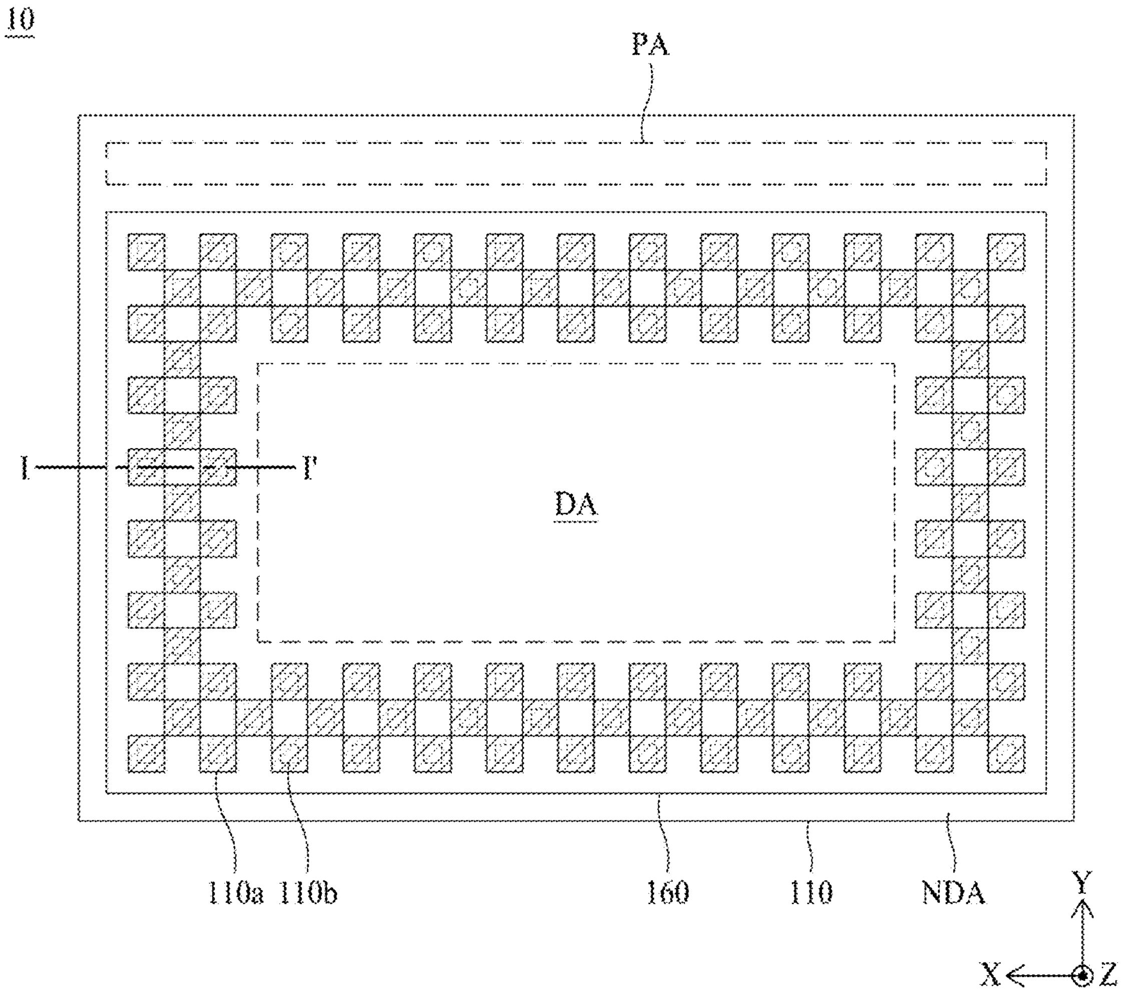
FIG. 2 is a plan view of a display panel according to an example embodiment of the present disclosure.
Figure 3:
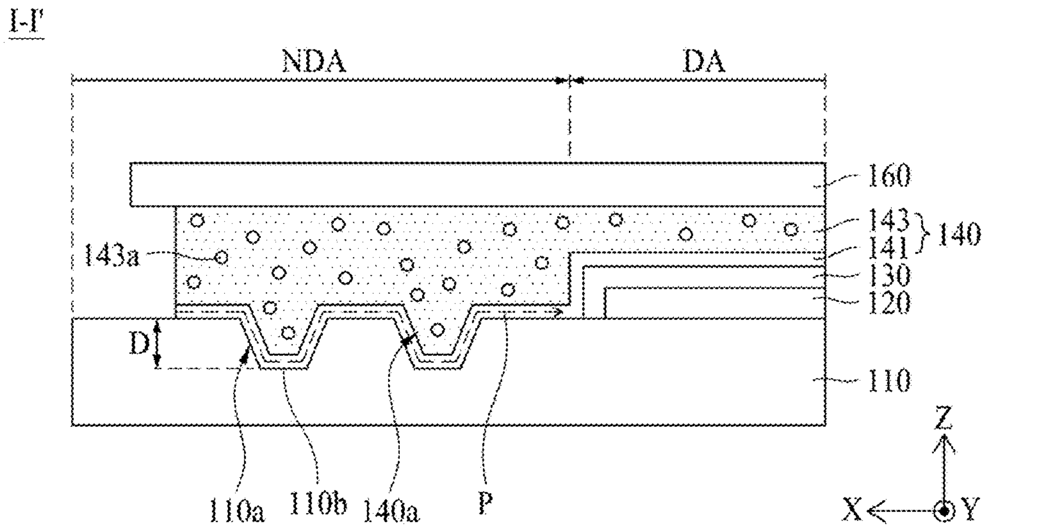
FIG. 3 is a cross-sectional view taken along line I-I' in FIG. 2.

FIG. 2 is a plan view of a display panel 10 according to an example embodiment of the present disclosure, and FIG. 3 is a cross-sectional view taken along line I-I' in FIG. 2.

As shown in FIGS. 2 and 3, the display panel 10 may include a first substrate 110, a second substrate 160 opposite to the first substrate 110, at least one electroluminescent device 120 provided in a display area DA of the first substrate 110, a passivation layer 130 covering the electroluminescent device 120, and an encapsulation layer 140 disposed between the first substrate 110 and the second substrate 160.

The first substrate 110 may include a transparent glass material. In embodiments where a display apparatus is a flexible display apparatus, the first substrate 110 may include a flexible material, such as plastic. Also, the first substrate 110 may extend farther out than the second substrate 160. A circuit unit and a pad part for supplying various signals to the electroluminescent device 120 may be provided in a pad area PA where the first substrate 110 does not overlap the second substrate 160. However, a dimension of the first substrate 110 is not limited thereto.

The first substrate 110 may include a first concave portion 110*a* which is formed in at least a portion of a non-display area NDA by removing a portion of the first substrate 110.

One or more first concave portions 110*a* of the first substrate 110 may be formed to have a polygonal trench pattern. One first concave portion 110*a* provided in the non-display area NDA of the first substrate 110 may be prepared to share at least one of an edge and a vertex of another first concave portion 110*a* adjacent to the one first concave portion 110*a*.

As illustrated in FIG. 2, a vertex of one tetragonal-pattern first concave portion 110*a* provided in the non-display area NDA of the first substrate 110 may contact a vertex of another tetragonal-pattern first concave portion 110*a* adjacent thereto. Here, an edge or a vertex of the trench pattern of a first concave portion 110*a* may denote an edge or a vertex with respect to a top portion (or opening) of the trench pattern of the first concave portion 110*a*.

Moreover, as illustrated in FIG. 2, one first concave portion 110*a* and another first concave portion 110*a* adjacent thereto may share an edge or a vertex and may each be formed independently. Here, being independently formed may denote that a pattern of the one first concave portion 110*a* is not interlocked with a pattern of the another first concave portion 110*a*.

Example alternative structures will be described below with reference to FIGS. 5 and 6 where the first concave portions 110*a* of the first substrate 110 are formed to have a polygonal trench pattern other than a tetragonal trench pattern.

The first concave portions 110*a* of the first substrate 110 may be formed to have a certain depth D and, for example, may have a depth of 1 μm or more. In the event that the depth D of the first concave portions 110*a* of the first substrate 110 is set to less than 1 μm, an effect of delaying a path of external gas or moisture may be reduced. An upper bound of the depth D of the first concave portions 110*a* of the first substrate 110 may not be specifically limited and may be set so as not to significantly affect the durability of the first substrate 110.

Therefore, the first substrate 110 according to example embodiments of the present disclosure may include a plurality of first concave portions 110*a* in the non-display area NDA that may be arranged at a certain interval and may function as a ruler or a marker for determining the degree of penetration of external gas or moisture. The display panel 10 according to example embodiments of the present disclosure may have a function of a ruler or a marker, which may be implemented through the color conversion of protrusion portions 140*a* of the encapsulation layer 140 formed in the concave portions 110*a*.

One or more first concave portions 110*a* formed in the non-display area NDA of the first substrate 110 may be set so that a bottom surface 110*b* of the first concave portion 110*a* has a smaller width than a top portion (or opening) of the first concave portion 110*a*. Thus, the first concave portion 110*a* may include a side surface having a certain slope and may have a trench structure where the bottom surface 110*b* of the first concave portion 110*a* has a smaller width than the top portion (or opening) of the first concave portion 110*a*.

For example, in the event that the first concave portion 110*a* of the first substrate 110 is formed in a vertical structure where a width of the top opening of the first concave portion 110*a* is the same as that of the bottom surface of the first concave portion 110*a*, empty regions may form in bonding the first substrate 110 with the encapsulation layer 140 such that a bonding force between the encapsulation layer 140 and the first substrate 110 may be reduced. Accordingly, as described above, the first concave portions 110*a* of the first substrate 110 may be shaped so that the bottom surface 110*b* of the first concave portions 110*a* has a smaller width than the top opening of the first concave portions 110*a*. Thus, the first concave portions 110*a* may include a side surface having a certain slope and may have a trench structure where the bottom surface 110*b* of the first concave portions 110*a* has a smaller width than the top opening of the first concave portions 110*a*.

The second substrate 160 may be disposed on the encapsulation layer 140. Like the first substrate 110, the second substrate 160 may include a transparent glass material or may include a flexible material, such as plastic. Also, in examples where the display apparatus 100 is a bottom emission type, the second substrate 160 may include a metal material.

The electroluminescent device 120 may be disposed on the first substrate 110 to emit light based on a data signal supplied through a driving TFT (not shown) and may irradiate light toward the first substrate 110 and/or the second substrate 160. Although not depicted, the electroluminescent device 120 according to example embodiments may include a first electrode, an electroluminescent layer, and a second electrode. Also, although not shown in FIG. 3, a planarization layer may be further provided so that the electroluminescent device 120 is formed on a flat surface.

The first electrode of the electroluminescent device 120 may be provided on the planarization layer and may be electrically connected to a source electrode of the driving TFT. The first electrode according to an example embodiment may include a transparent conductive material, such as transparent conductive oxide (TCO), so that light emitted from the electroluminescent device 120 is irradiated toward the first substrate 110. For example, the first electrode may include indium tin oxide (ITO) or indium zinc oxide (IZO). Also, the first electrode according to an example embodiment of the present disclosure may include a metal material or a transparent conductive material. For example, the first electrode may include a metal material having a high reflectance, such as a stack structure (Ti/Al/Ti) of aluminum (Al) and titanium (Ti), a stack structure (ITO/Al/ITO) of aluminum (Al) and ITO, a silver (Ag) alloy, and a stack structure (ITO/Ag alloy/ITO) of a silver (Ag) alloy and ITO. Here, the silver (Ag) alloy may be an alloy of silver (Ag), palladium (Pd), and copper (Cu) and may be referred as an APC alloy.

The electroluminescent layer of the electroluminescent device 120 may be formed on the first electrode and may directly contact the first electrode. The electroluminescence layer according to an example embodiment may include one of an organic light emitting layer, an inorganic light emitting layer, and a quantum dot light emitting layer, or may include a stack or combination structure of an organic light emitting layer (or an inorganic light emitting layer) and a quantum dot light emitting layer.

The second electrode of the electroluminescent device 120 may be formed on the electroluminescent layer and may directly contact the electroluminescence layer. The second electrode according to an example embodiment may be a cathode electrode of the electroluminescent device 120. The second electrode according to an example embodiment may include a metal material having a high reflectance so as to reflect light emitted from the electroluminescent layer and incident thereon back toward the first substrate 110. For example, the second electrode may be formed in a multi-layer structure, such as a stack structure (Ti/Al/Ti) of aluminum (Al) and titanium (Ti), a stack structure (ITO/Al/ITO) of aluminum (Al) and ITO, an APC (Ag/Pd/Cu) alloy, or a stack structure (ITO/APC/ITO) of an APC alloy and ITO, or may include a single-layer structure including one material or an alloy of two or more materials selected from among silver (Ag), aluminum (Al), molybdenum (Mo), gold (Au), magnesium (Mg), calcium (Ca), and barium (Ba).

Alternatively, the second electrode of the electroluminescent device 120 may include a transparent conductive material, such as TCO, so that light emitted from the electroluminescent layer and incident thereon is transmitted toward the second substrate 160. For example, the second electrode may include ITO or IZO.

The passivation layer 130 may be provided in the display area DA to cover the electroluminescent device 120. Also, the passivation layer 130 according to another example embodiment may overlap at least a portion of the non-display area NDA. The passivation layer 130 may perform a function of protecting the electroluminescent device 120. The passivation layer 130 may include at least one of aluminum oxide ($Al_2O_3$), silicon oxide (SiOx), silicon nitride (SiNx), and silicon oxynitride (SiON) and may be formed of a single layer or multiple layers where one or more inorganic layers are stacked.

Moreover, the passivation layer 130 may function as a barrier layer to protect the electroluminescent device 120 from external gas or moisture along with a below-described encapsulation layer 140.

The encapsulation layer 140 may be disposed on the passivation layer 130. The encapsulation layer 140 may protect the electroluminescent device 120 from the penetration of external particles, impact, moisture, or oxygen.

The encapsulation layer 140 may fix the first substrate 110 and the second substrate 160 by using a face seal scheme. The first substrate 110 and the second substrate 160 may be attached to each other by the encapsulation layer 140.

The encapsulation layer 140 may include a first encapsulation layer 141 covering the electroluminescent device 120 and a second encapsulation layer 143 disposed on the first encapsulation layer 141. The first encapsulation layer 141 may be implemented without an absorption member to enhance an interface adhesive force between the first substrate 110 and the encapsulation layer 141.

The first encapsulation layer 141 and the second encapsulation layer 143 may include resin and, for example, may include at least one of epoxy, phenol, amino, unsaturated polyester, rubber, polyimide, silicone, acryl, vinyl, and olefin. The first encapsulation layer 141 and the second encapsulation layer 143 may include the same material.

Moreover, the second encapsulation layer 143 may further include moisture absorbing members 143*a* for more effectively protecting the electroluminescent device 120.

The moisture absorbing members 143*a* may include a material to absorb external oxygen or moisture flowing into a display apparatus from the outside. The moisture absorbing members 143*a* may be organic material-based absorption members or inorganic material-based absorption members.

For example, the moisture absorbing members 143*a* may use an inorganic phosphorus compound, metal oxide, metal halide, metal inorganic acid salt, organic acid salt, or a porous inorganic compound. For example, the moisture absorbing members 143*a* may use phosphorous oxychloride ($POCl_3$), phosphorous pentaoxide ($P_2O_5$), barium oxide (BaO), magnesium oxide (MgO), calcium oxide (CaO), strontium oxide (SrO), silica gel ($SiO_2$), aluminum oxide ($Al_2O_3$), calcium chloride ($CaCl_2$), potassium carbonate ($K_2CO_3$), potassium hydroxide (KOH), sodium hydroxide (NaOH), lithium hydroxide (LiOH), lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), nickel sulfate ($NiSO_4$), or zeolite. The moisture absorbing members 143*a* may have a particle size of 0.01 μm to 50 μm.

However, materials of the moisture absorbing members 143*a* are not limited to the specific examples described above. Other oxygen absorbing material or moisture absorbing material known to those skilled in the art may be applied thereto.

In the event that the first encapsulation layer 141 does not include any absorption member, the first encapsulation layer 141 may act as a penetration path P of external oxygen or moisture as illustrated in FIG. 3, and the durability of a display apparatus may thus be reduced. Therefore, the first encapsulation layer 141 may include protrusion portions 140*a* formed in the first concave portions 110*a* of the first substrate so that the potential penetration path P of external oxygen or moisture may lengthen. Also, in the event that the penetration path P of external oxygen or moisture is lengthened by the protrusion portions 140*a* described above, the absorption members 143*a* of the second encapsulation layer 143 may absorb more of external oxygen or moisture to prevent or reduce external oxygen or moisture from penetrating into the display area DA.

The encapsulation layer 140 may seal the electroluminescent device 120 and, thus, may protect the electroluminescent device 120 from the penetration of external particles, impact, moisture, or oxygen. The encapsulation layer 140 may also bond and fix the first substrate 110 to the second substrate 160. The encapsulation layer 140 may bond the first substrate 110 to the second substrate 160 by using the face seal scheme. Also, the encapsulation layer 140 may be first laminated on the second substrate 160. Then, the second substrate 160 with the encapsulation layer 140 may be bonded to first substrate 110 to cover a plurality of electroluminescent devices 120.

Moreover, the encapsulation layer 140 including the first encapsulation layer 141 and the second encapsulation layer 143 may include the protrusion portions 140*a* corresponding to the first concave portions 110*a* of the first substrate 110. The encapsulation layer 140 including the protrusion portions 140*a* may be prepared to correspond to the first concave portion 110*a* of the first substrate 110 and then be bonded to the first substrate 110 including the first concave portion 110*a* through a lamination process.

In a case where the first encapsulation layer 141 of the encapsulation layer 140 acts as a potential penetration path P of oxygen or moisture flowing in from the outside, the encapsulation layer 140 may include the protrusion portions 140*a* formed to overlap the first concave portions 110*a* of the substrate 110. Thus, the penetration path P passing through the first encapsulation layer 141 may lengthen, thereby delaying the penetration of external oxygen into the electroluminescent device 120 or the display area DA of the display apparatus.

According to an example embodiment, the protrusion portions 140*a* may include portions of the first encapsulation layer 141 and portions of the second encapsulation layer 143, which are accommodated into the first concave portions 110*a* of the first substrate 110. The protrusion portions 140*a* may include some of the absorption members 143*a* of the second encapsulation layer 143. In the event that some the absorption members 143*a* absorb external gas or moisture, color conversion may occur in those absorption members 143*a*. Users may differentiate those absorption members 143*a* on which color conversion does not occur from color-converted absorption members 143*a* with their naked eyes.

Figure 4A:
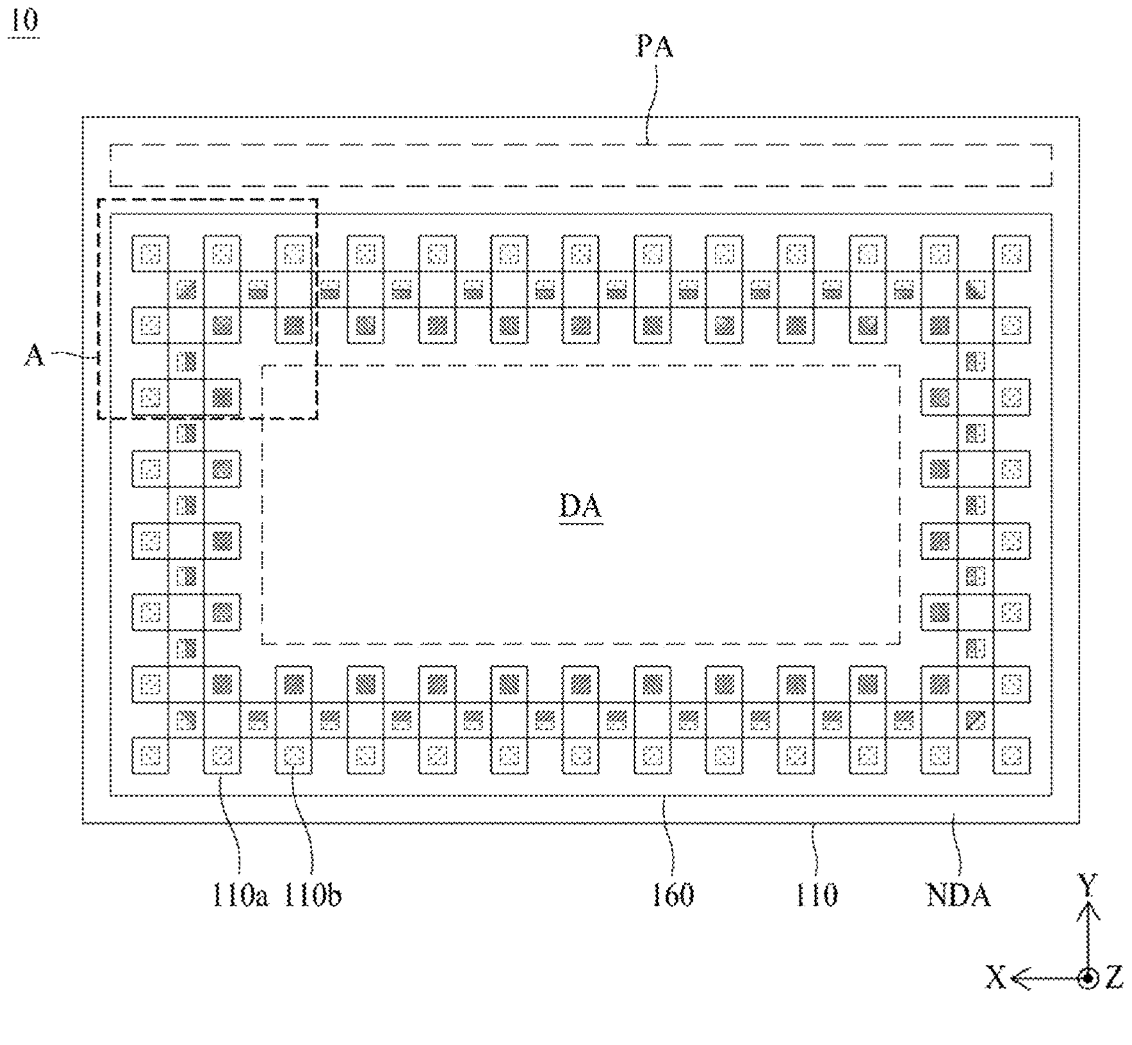
FIG. 4A illustrates an example where external particles are absorbed into a getter of an encapsulation layer according to an example embodiment of the present disclosure.
Figure 4B:
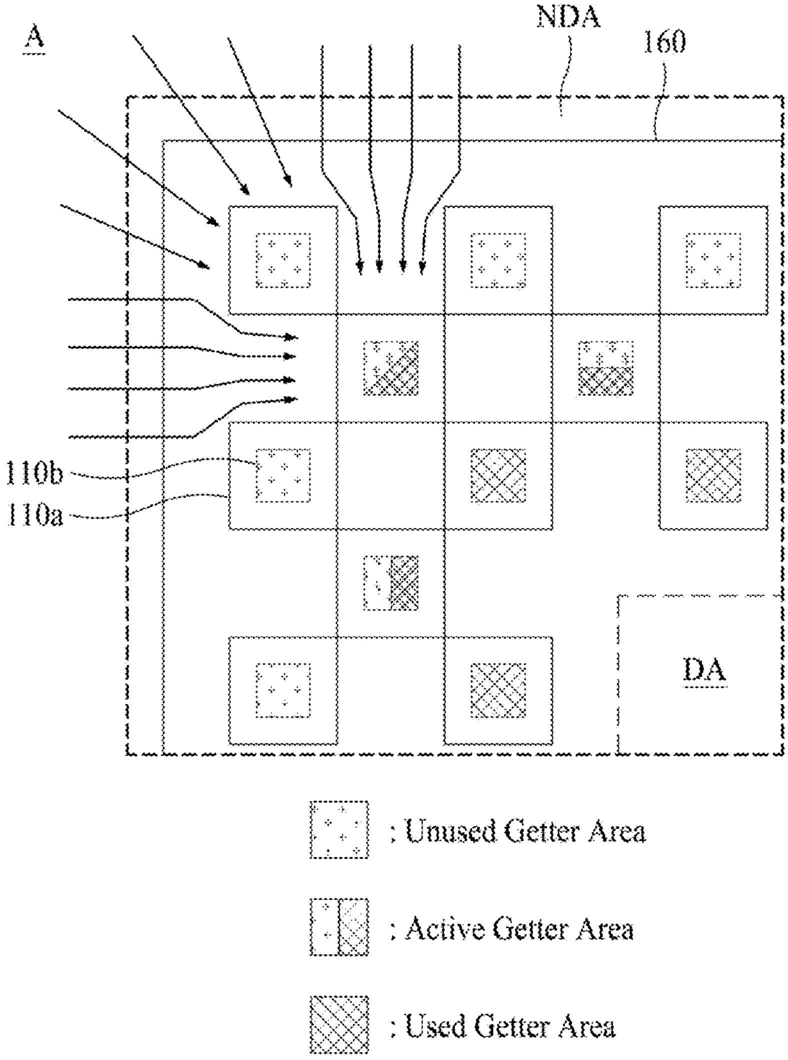
FIG. 4B illustrates an enlarged view of a region A in FIG. 4A.

FIG. 4A illustrates an example where external particles are absorbed into getter areas of an encapsulation layer according to an example embodiment of the present disclosure. FIG. 4B illustrates an enlarged view of a region A of FIG. 4A. In FIG. 4B, arrows represent external gas or moisture flowing in from the outside of a non-display area NDA.

As illustrated in FIGS. 4A and 4B, with respect to the absorption members 143*a* of the second encapsulation layer 143 accommodated into at least a portion of the first concave portions 110*a* of a first substrate 110, one or more used getter areas may be disposed in a region adjacent to a display area DA, one ore more unused getter areas may be disposed in a region adjacent to an outermost portion of a non-display area NDA, and one or more active getter areas may be disposed between the used getter areas and the unused getter areas.

Moreover, in FIG. 4B, a diagonal-line-hatched region in the bottom surface 110*b* of a first concave portion 110*a* may represent a region where color conversion occurred due to the penetration of external gas or external moisture which is then absorbed by the absorption members.

As described above, the absorption members 143*a* of the second encapsulation layer 143 according to example embodiments of the present disclosure may be prepared so that at least a portion thereof is accommodated into the first concave portions 110*a* of the first substrate 110. Accordingly, the absorption members 143*a* of the second encapsulation layer 143 accommodated into the first concave portions 110*a* of the first substrate 110 may function as a ruler or a marker with respect to external gas or moisture penetrating into the display apparatus from the outside.

Such example embodiments of the present disclosure, in which the display panel 10 may function as a ruler or a marker, may be implemented through the color conversion of the protrusion portions 140*a* of the encapsulation layer 140 which are formed to correspond to and be disposed within the concave portions 110*a*.

According to example embodiments of the present disclosure, the protrusion portions 140*a* may include portions of the first encapsulation layer 141 and portions of the second encapsulation layer 143, which are accommodated into the first concave portions 110*a* of the first substrate 110. The protrusion portions 140*a* may include some of the absorption members 143*a* of the second encapsulation layer 143. In the event that some of the absorption members 143*a* absorb external gas or moisture, color conversion may occur in those absorption members 143*a*. Users may differentiate those absorption members 143*a* on which color conversion does not occur from color-converted absorption members 143*a* with their naked eyes.

Figure 5:
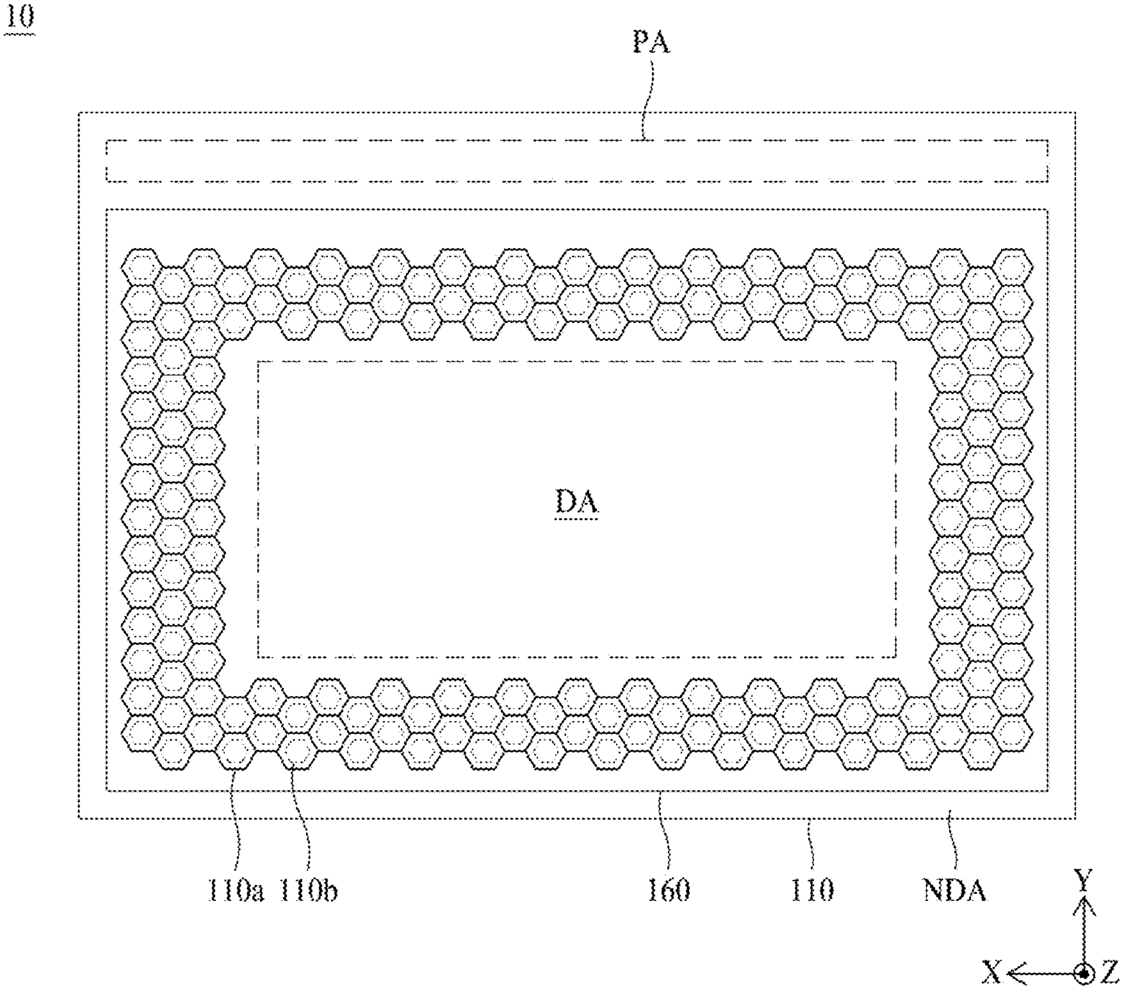
FIGS. 5 and 6 are plan views of a display panel according to another example embodiment of the present disclosure.
Figure 6:
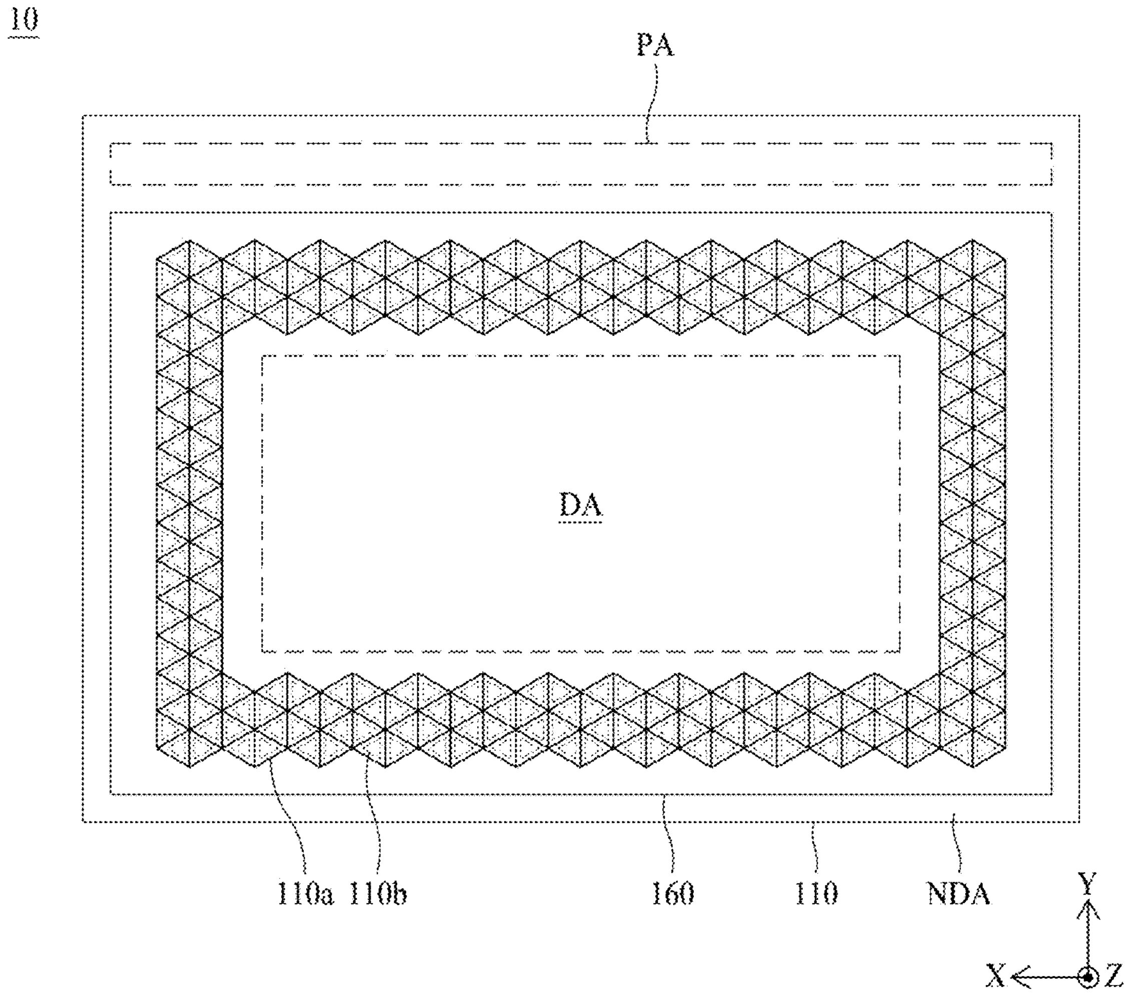

FIGS. 5 and 6 are plan views of a display panel 10 according to other example embodiments of the present disclosure. Except for a shape of each first concave portion 110*a* provided in a non-display area NDA of a first substrate 110, and a shape of each corresponding protrusion portions 140*a* of the encapsulation layer 140, example display apparatuses illustrated in FIGS. 5 and 6 have similar structures as the example display apparatus described above with reference to FIGS. 1 to 4B. Thus, redundant descriptions may be omitted.

As illustrated in FIGS. 5 and 6, first concave portions 110*a* provided in a non-display area NDA of a first substrate 110 may be prepared so that an edge of one first concave portion 110*a* shares at least one of an edge and a vertex of at least one other first concave portion 110*a* adjacent thereto.

For example, as illustrated in FIGS. 5 and 6, the first concave portions 110*a* provided in the non-display area NDA of the first substrate 110 may be provided in an arrangement where the first concave portions 110*a* are repeated with a hexagonal pattern or a triangular pattern. Also, one first concave portion 110*a* may share at least one edge with at least one other first concave portion 110*a*.

As illustrated in FIG. 5, one first concave portion 110*a* having a hexagonal pattern provided in the non-display area NDA of the first substrate 110 may share an edge with at least one other first concave portion 110*a* having a hexagonal pattern adjacent thereto.

As illustrated in FIG. 6, one first concave portion 110*a* having a triangular pattern provided in the non-display area NDA of the first substrate 110 may share an edge with at least one other first concave portion 110*a* having a triangular pattern adjacent thereto.

Here, an edge or a vertex of a first concave portion 110*a* may denote an edge or a vertex defined with respect to a top portion or opening of the first concave portion 110*a*.

Figure 7A:
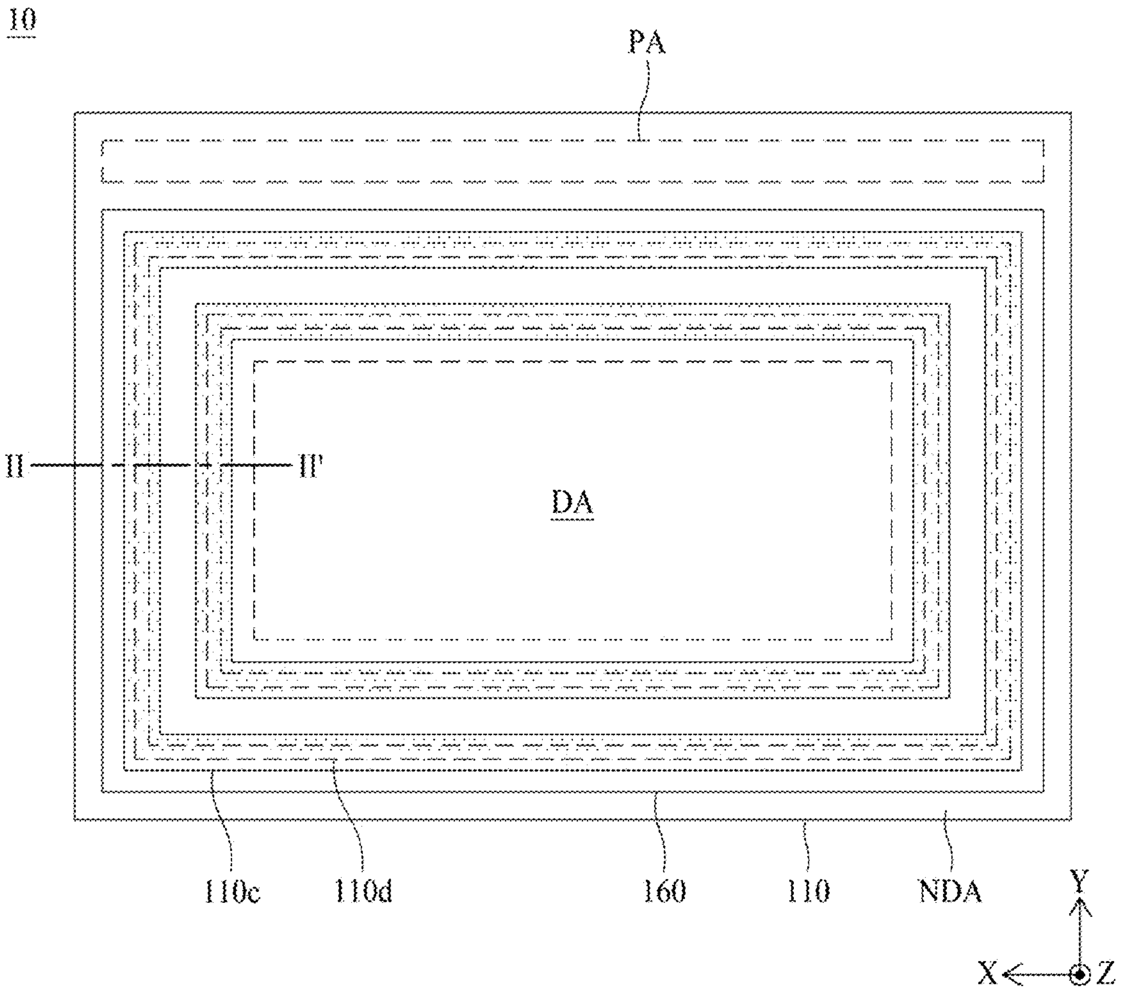
FIG. 7A is a plan view of a display panel according to another example embodiment of the present disclosure.
Figure 7B:
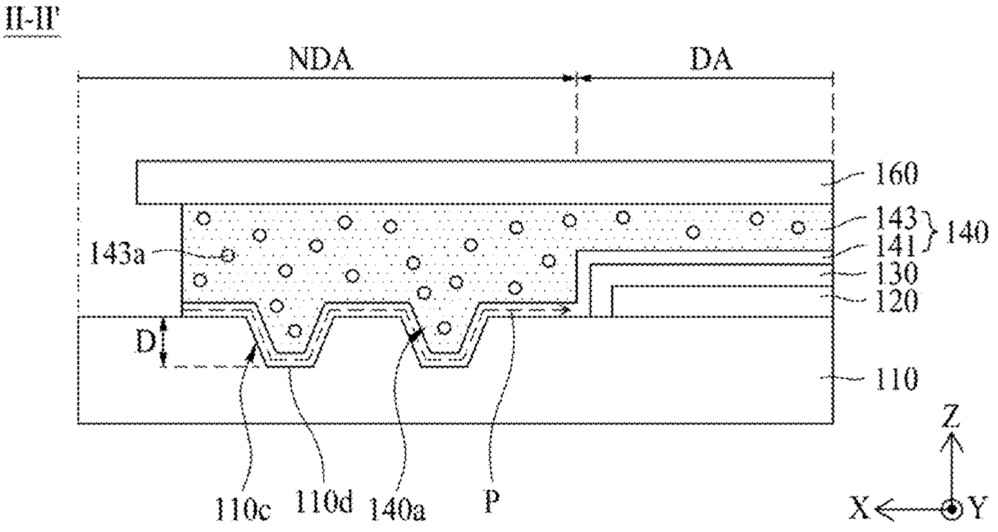
FIG. 7B is a cross-sectional view taken along line II-II' in FIG. 7A.

FIG. 7A is a plan view of a display panel 10 according to another example embodiment of the present disclosure. FIG. 7B is a cross-sectional view taken along line II-II' in FIG. 7A. Except for a shape of each first concave portion 110*a* provided in a non-display area NDA of a first substrate 110, and a shape of each corresponding protrusion portions 140*a* of the encapsulation layer 140, an example display apparatus illustrated in FIGS. 7A and 7B has a similar structure as the example display apparatus described above with reference to FIGS. 1 to 4B. Thus, redundant descriptions may be omitted.

As illustrated in FIGS. 7A and 7B, a first substrate 110 of the display panel 10 according to another example embodiment of the present disclosure may include second concave portions 110*c* (each with a bottom surface 110*d*) formed in at least a portion of a non-display area NDA. The second concave portions 110*c* may be provided in the non-display area NDA of the first substrate 110 and may be provided in a loop shape surrounding a display area DA.

Unlike a pattern of discontinuous first concave portions 110*a*, the second concave portions 110*c* may be formed in a loop shape surrounding a display area DA and may accordingly have a greater volume collectively than the first concave portions 110*a* illustrated, e.g., in FIGS. 4A, 4B, 5 and 6. Therefore, a collective volume of portions of an encapsulation layer 140 filling the second concave portions 110*c* may be greater than a collective volume of portions of an encapsulation layer 140 filling the first concave portions 110*a*. Similarly, a collective volume of absorption members 143*a* of a second encapsulation layer 143 disposed in the second concave portions 110*c* may be greater than a collective volume of absorption members 143*a* of a second encapsulation layer 143 disposed in the first concave portions 110*a*.

Therefore, the second concave portions 110*c* formed in a loop shape surrounding the display area DA may collectively have an increased volume of the absorption members 143*a* of the second encapsulation layer 140 disposed therein, thereby enhancing an absorption characteristic.

The second concave portions 110*c* of the first substrate 110 may be formed to have a certain depth D and, for example, may have a depth of 1 μm or more. In the event that the depth D of the second concave portion 110*c* of the first substrate 110 is set to less than 1 μm, an effect of delaying a path of external gas or moisture may be reduced. An upper bound of the depth D of the second concave portions 110*c* of the first substrate 110 may not be specifically limited and may be set so as not to significantly affect the durability of the first substrate 110.

Moreover, the depth D of the second concave portions 110*c* of the first substrate 110 may be set to the same depth as the depth D of the first concave portions 110*a* of the first substrate 110 described above with reference to FIG. 2. Alternatively, the depth D of the second concave portions 110*c* of the first substrate 110 may be set to a depth which differs from the depth D of the first concave portions 110*a* of the first substrate 110 described above with reference to FIG. 2.

Figure 8A:
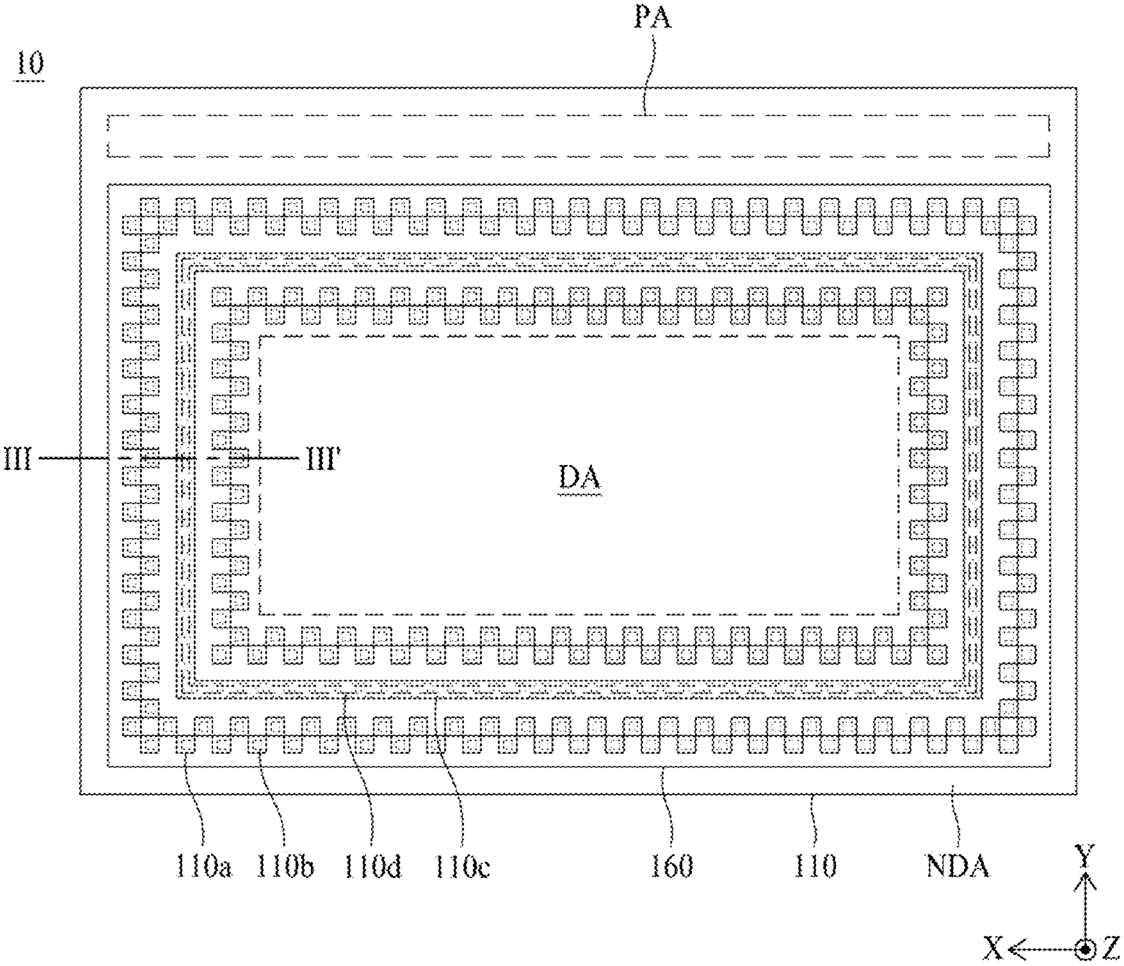
FIG. 8A is a plan view of a display panel according to another example embodiment of the present disclosure.
Figure 8B:
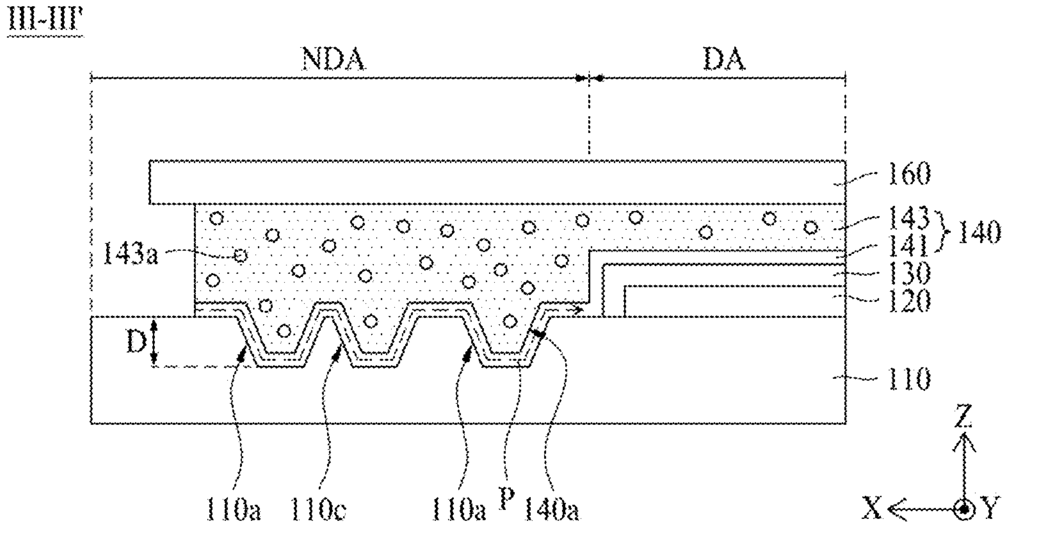
FIG. 8B is a cross-sectional view taken along line III-III' in FIG. 8A.

FIG. 8A is a plan view of a display panel 10 according to another example embodiment of the present disclosure. FIG. 8B is a cross-sectional view taken along line III-III' in FIG. 8A. Except for a shape of each first concave portion 110*a* and a shape of each second concave portion 110*c* provided in a non-display area NDA of a first substrate 110, and a shape of each corresponding protrusion portions 140*a* of the encapsulation layer 140, an example display apparatus illustrated in FIGS. 8A and 8B has a similar structure as the example display apparatus described above with reference to FIGS. 1 to 4B. Thus, redundant descriptions may be omitted.

As illustrated in FIGS. 8A and 8B, a first substrate 110 of the display panel 10 according to another example embodiment of the present disclosure may include first concave portions 110*a* and a second concave portion 110*c*, which are formed in at least a portion of a non-display area NDA. Here, the first concave portions 110*a* of the first substrate 110 may be the same as any of the example first concave portions 110*a* described above with reference to FIGS. 1 to 6. The second concave portion 110*c* may be the same as the example second concave portions 110*c* described above with reference to FIGS. 7A and 7B.

The first concave portions 110*a* and the second concave portion 110*c* of the first substrate 110 may be formed to have a certain depth D and, for example, may have a depth of 1 μm or more. In the event that the depth D of each of the first concave portions 110*a* and the second concave portion 110*c* of the first substrate 110 is set to less than 1 μm, an effect of delaying a path of external gas or moisture may be reduced. An upper bound of the depth D of the first concave portions 110*a* and of the second concave portion 110*c* of the first substrate 110 may not be specifically limited and may be set so as not to significantly affect the durability of the first substrate 110.

Moreover, the first concave portions 110*a* and the second concave portion 110*c* may be provided to have the same depth or may be provided to have different depths.

Therefore, the display panel 10 according to another example embodiment of the present disclosure may include the first concave portions 110*a*, which may functions as a ruler or a marker with respect to the penetration of external gas or external moisture flowing in from the outside of a display apparatus. The example display panel 10 may also include the second concave portion 110*c* with a relatively large volume to accommodate a larger volume of absorption members 143*a* of a second encapsulation layer 143. Thus, the example display panel 110 may effectively delay or prevent the penetration of external gas or external moisture from the outside and may enhance the reliability of the display apparatus.

Figure 9A:
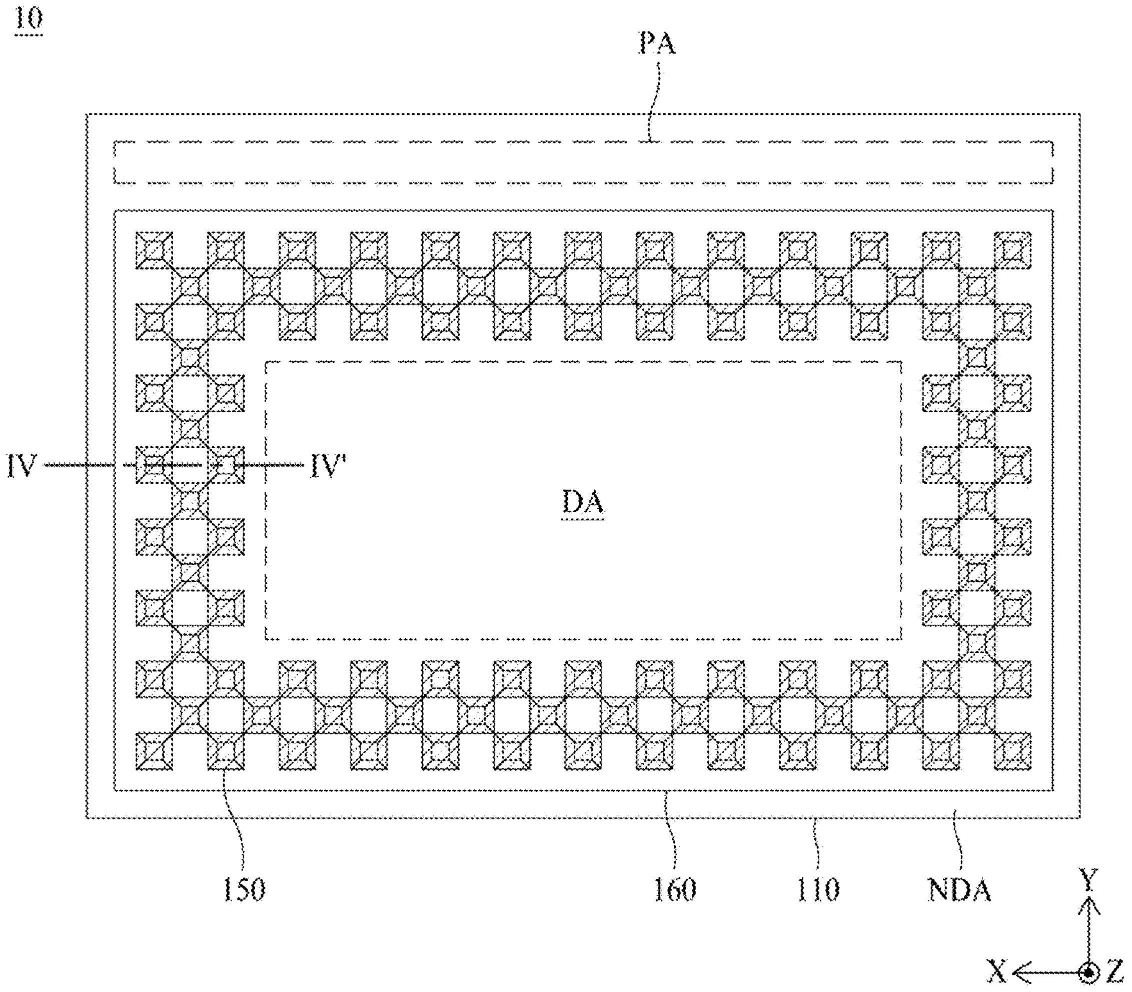
FIG. 9A is a plan view of a display panel according to another example embodiment of the present disclosure.
Figure 9B:
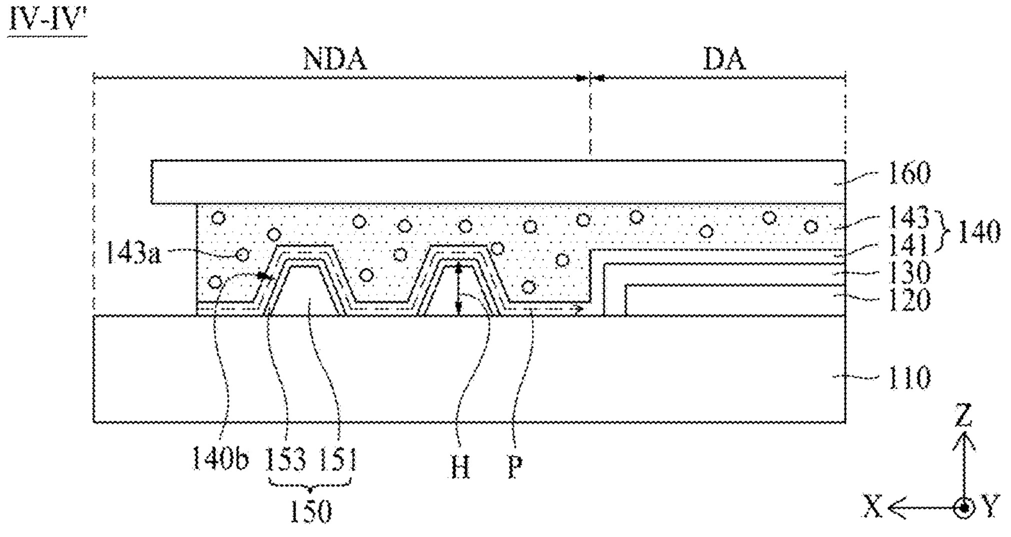
FIG. 9B is a cross-sectional view taken along line IV-IV' in FIG. 9A.

FIG. 9A is a plan view of a display panel 10 according to another example embodiment of the present disclosure. FIG. 9B is a cross-sectional view taken along line IV-IV' in FIG. 9A. Except for protrusion members 150 being provided instead of first concave portions 110*a* in a non-display area NDA of a first substrate 110, an example display apparatus illustrated in FIGS. 9A and 9B has a similar structure as the example display apparatus described above with reference to FIGS. 1 to 4B. Thus, redundant descriptions may be omitted.

As illustrated in FIGS. 9A and 9B, the display panel 10 according to another example embodiment of the present disclosure may include protrusion members 150 provided in at least a portion of a non-display area NDA of a first substrate 110 to protrude toward a second substrate 160.

The protrusion members 150 may include organic protrusion members 151 formed in at least portions of the non-display area NDA of the first substrate 110 to protrude toward the second substrate 160. The protrusion members 150 may also include inorganic protrusion members 153 covering the organic protrusion member 151.

The organic protrusion members 151 may be provided on the first substrate 110 in at least portions of the non-display area NDA of the first substrate 110 and may be formed to protrude toward a second substrate 160. The organic protrusion members 151 may include at least one of acryl resin, epoxy resin, phenolic resin, polyamide resin, and polyimide resin.

The inorganic protrusion members 153 may be formed to cover the organic protrusion members 151. The inorganic protrusion members 153 may include at least one of aluminum oxide ($Al_2O_3$), silicon oxide (SiOx), silicon nitride (SiNx), and silicon oxynitride (SiON) and may be formed of a single layer or multiple layers where one or more inorganic layers are stacked.

Moreover, the protrusion members 150 may be formed in a structure where a horizontal width of a lower end of the protrusion member 150 is greater than a horizontal width of an upper end of the protrusion member 150. Thus, the protrusion members 150 may have a protrusion structure with a side surface having a certain slope.

For example, in the event that the protrusion members 150 are formed in a vertical structure where a width of a top surface of the protrusion member 150 is the same as a width of a bottom surface of the protrusion member 150, an empty region may occur in bonding with the encapsulation layer 140 such that the bonding force between the encapsulation layer 140 on one hand and the first substrate 110 and the protrusion members 150 on the other may be reduced. Accordingly, as described above, the protrusion members 150 may be formed in a structure where a horizontal width of the lower end of the protrusion member 150 is greater than a horizontal width of the upper end of the protrusion member 150 so that the protrusion members 150 may have a protrusion structure including a side surface having a certain slope.

The protrusion members 150 may be formed to have a certain height H. For example, the height H of the protrusion members 150 may be set between 1 μm and 10 μm. In the event that the height H of the protrusion members 150 is set to less than 1 μm, an effect of delaying a path of external gas or moisture may be reduced. Also, in the event that the height H of the protrusion members 150 is set to more than 10 μm, a volume of each of a second encapsulation layer 143 and absorption members 143*a* may be reduced. Accordingly, it may be difficult to delay or prevent the penetration of external gas or external moisture into an electroluminescent device 120.

Moreover, as illustrated in FIG. 9A, one protrusion member 150 and another protrusion member 150 adjacent thereto may share an edge or a vertex and may each be formed independently. Here, being independently formed may denote that a pattern of the one protrusion member 150 is not interlocked with a pattern of the adjacent protrusion member 150. According to an example embodiment, each of the one protrusion member 150 and the adjacent protrusion member 150 may be an island protrusion pattern which is formed as a separate protrusion pattern.

As shown in FIG. 9B, in a case where the first encapsulation layer 141 does not include any absorption member, the first encapsulation layer 141 may act as a penetration path P of external oxygen or external moisture. Accordingly, the durability of a display apparatus may be reduced. Therefore, the first encapsulation layer 141 may include encapsulation layer concave portions 140*b* formed to correspond to the protrusion members 150 formed on the first substrate 110. Then, the penetration path P of external oxygen or external moisture may lengthen. Also, in the event that the penetration path P of external oxygen or external moisture is lengthened by the encapsulation layer concave portions 140*b*, the absorption members 143*a* of the second encapsulation layer 143 may absorb more of external oxygen or external moisture to prevent or reduce external oxygen or external moisture from penetrating into the display area DA.

Here, portions of the encapsulation layer 140 disposed between two adjacent protrusion members 150 may have a similar structure and serve a similar function in a similar way as the protrusion portions 140*a* of the encapsulation layer 140 in example embodiments described above with respect to FIGS. 2 to 8B. For example, these portions of the encapsulation layer 140 disposed between two adjacent protrusion members 150 may include absorption members 143 of the second encapsulation layer. Thus, the portions of the encapsulation layer 140 between two adjacent protrusion members 150 may be considered protrusion portions of the encapsulation layer 140.

Moreover, the encapsulation layer 140 including the first encapsulation layer 141 and the second encapsulation layer 143 may include the encapsulation layer concave portions 140*b* corresponding to the protrusion members 150 formed on the first substrate 110. The encapsulation layer 140 including the encapsulation layer concave portions 140*b* may be prepared to correspond to the protrusion members 150 and then be bonded with the first substrate 110 including the protrusion members 150 through a lamination process.

A display apparatus according to various example embodiments of the present disclosure will be described below.

A display apparatus according to an embodiment of the present disclosure may include: a first substrate including a display area and a non-display area surrounding the display area, the first substrate having at least one concave portion recessed into the first substrate in the non-display area; an encapsulation layer on the first substrate and disposed in the at least one concave portion; and a second substrate on the encapsulation layer and overlapping the first substrate.

According to some embodiments of the present disclosure, the at least one concave portion of the first substrate may include a plurality of first concave portions each having a polygonal trench pattern.

According to some embodiments of the present disclosure, one of the first concave portions may share an edge or a vertex of the polygonal trench pattern with another of the first concave portions, and the one of the first concave portions may not be interlocked with the another of the first concave portions.

According to some embodiments of the present disclosure, the first concave portions may be arranged to form a loop surrounding the display area.

According to some embodiments of the present disclosure, the at least one concave portion may further include a second concave portion having a loop shape surrounding the display area, and the first concave portions may be disposed at one or more sides of the second concave portion.

According to some embodiments of the present disclosure, the at least one concave portion may have a loop shape surrounding the display area.

According to some embodiments of the present disclosure, the encapsulation layer may include: a first encapsulation layer on the first substrate; and a second encapsulation layer between the first encapsulation layer and the second substrate, the second encapsulation layer including a plurality of absorption members for absorbing gas or moisture.

According to some embodiments of the present disclosure, the encapsulation layer may include at least one protrusion portion disposed in the at least one concave portion of the first substrate and having a shape corresponding to a shape of the at least one concave portion, and the at least one protrusion portion of the encapsulation layer may include a plurality of absorption members for absorbing gas or moisture.

According to some embodiments of the present disclosure, the at least one concave portion of the first substrate may have a depth of at least 1 μm and may include a sloped side surface.

A display apparatus according to an embodiment of the present disclosure may include: a first substrate including a display area and a non-display area surrounding the display area; at least one protrusion member on the first substrate in the non-display area; an encapsulation layer on the first substrate and on the at least one protrusion member, the encapsulation layer being adhered to the at least one protrusion member; and a second substrate on the encapsulation layer and overlapping the first substrate, wherein the at least one protrusion member is between the first substrate and the second substrate and protrudes toward the second substrate.

According to some embodiments of the present disclosure, the at least one protrusion member may include a plurality of protrusion members each having a polygonal protrusion pattern, and one of the protrusion members may share an edge or a vertex of the polygonal protrusion pattern with another of the protrusion members.

According to some embodiments of the present disclosure, the at least one protrusion member may include: an organic protrusion member on the first substrate in the non-display area and protruding toward the second substrate; and an inorganic protrusion member covering the organic protrusion member.

According to some embodiments of the present disclosure, the encapsulation layer may include: a first encapsulation layer on the first substrate and the at least one protrusion member; and a second encapsulation layer between the first encapsulation layer and the second substrate, the second encapsulation layer including a plurality of absorption members for absorbing gas or moisture.

According to some embodiments of the present disclosure, the encapsulation layer may include at least one encapsulation layer concave portion having a shape corresponding to a shape of the at least one protrusion member, and the at least one protrusion member may be disposed in the at least one encapsulation layer concave portion.

According to some embodiments of the present disclosure, the at least one concave portion may include a sloped side surface and may have a height of between 1 μm and 10 μm.

A display apparatus according to an embodiment of the present disclosure may include: a first substrate including a display area and a non-display area surrounding the display area; an encapsulation layer on the first substrate and having at least one protrusion portion in the non-display area; and a second substrate on the encapsulation layer and overlapping the first substrate, wherein the at least one protrusion portion of the encapsulation layer is between the first substrate and the second substrate and protrudes away from the second substrate.

According to some embodiments of the present disclosure, the first substrate may include at least one concave portion recessed into the first substrate in the non-display area, and the at least one protrusion portion of the encapsulation layer may be disposed within the at least one concave portion of the first substrate and may have a shape corresponding to a shape of the at least one concave portion of the first substrate.

According to some embodiments of the present disclosure, the at least one concave portion of the first substrate may include either or both of: a plurality of first concave portions having a polygonal trench pattern, wherein one of the first concave portions shares an edge or a vertex of the polygonal trench pattern with another of the first concave patterns, and at least one second concave portion having a loop shape surrounding the display area.

According to some embodiments of the present disclosure, the display apparatus may further include at least two protrusion members on the first substrate, each including: an organic protrusion member on the first substrate in the non-display area and protruding toward the second substrate; and an inorganic protrusion member covering the organic protrusion member, wherein the at least one protrusion portion of the encapsulation layer may be disposed between the at least two protrusion members.

According to some embodiments of the present disclosure, the encapsulation layer may include: a first encapsulation layer on the first substrate; and a second encapsulation layer between the first encapsulation layer and the second substrate, the second encapsulation layer including a plurality of absorption members for absorbing gas or moisture.

The above-described feature, structure, and effect of the present disclosure are included in at least one example embodiment of the present disclosure but are not limited to only one embodiment. Furthermore, the feature, structure, and effect described in at least one example embodiment of the present disclosure may be implemented through combination with or modification of other example embodiments by those skilled in the art. Therefore, contents associated with such combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus, comprising:

a first substrate including a display area and a non-display area surrounding the display area, the first substrate having at least one concave portion recessed into the first substrate in the non-display area;

a first encapsulation layer on the first substrate and disposed in the at least one concave portion of the first substrate;

a second encapsulation layer disposed in the at least one concave portion of the first substrate on the first encapsulation layer; and a second substrate on the second encapsulation layer and overlapping the first substrate, wherein the second encapsulation layer includes a plurality of absorption members for absorbing gas or moisture, and some of the plurality of absorption members are disposed in the at least one concave portion of the first substrate, wherein the at least one concave portion of the first substrate includes a plurality of first concave portions each having a polygonal trench pattern, wherein one of the first concave portions shares an edge or a vertex of the polygonal trench pattern with one other of the first concave portions, and wherein the one of the first concave portions is not interlocked with the one other of the first concave portions.

2. The display apparatus of claim 1, wherein the first concave portions are arranged to form a loop surrounding the display area.

3. The display apparatus of claim 1, wherein the at least one concave portion further includes a second concave portion having a loop shape surrounding the display area, and wherein the first concave portions are disposed at one or more sides of the second concave portion.

4. The display apparatus of claim 1, wherein the at least one concave portion has a loop shape surrounding the display area.

5. The display apparatus of claim 1, wherein the second encapsulation layer comprises at least one protrusion portion disposed in the at least one concave portion of the first substrate and having a shape corresponding to a shape of the at least one concave portion, and wherein the at least one protrusion portion of the second encapsulation layer includes a plurality of absorption members for absorbing gas or moisture.

6. The display apparatus of claim 1, wherein the at least one concave portion of the first substrate has a depth of at least 1 μm and includes a sloped side surface.

7. The display apparatus of claim 1, wherein the first encapsulation layer is disposed on a side surface and a bottom surface of the at least one concave portion of the first substrate.

8. The display apparatus of claim 7, wherein:

the first encapsulation layer is disposed between the second encapsulation layer in the at least one concave portion and the side surface and the bottom surface of the at least one concave portion of the first substrate; and the second encapsulation layer does not directly contact the side surface and the bottom surface of the at least one concave portion of the first substrate.

9. A display apparatus, comprising:

a first substrate including a display area and a non-display area surrounding the display area;

an encapsulation layer on the first substrate and having at least one protrusion portion in the non-display area of the first substrate, the encapsulation layer including:

a first encapsulation layer on the first substrate; and a second encapsulation layer on the first encapsulation layer; and a second substrate on the second encapsulation layer and overlapping the first substrate, wherein the at least one protrusion portion of the encapsulation layer is between the first substrate and the second substrate, includes a portion of the first encapsulation layer and a portion of the second encapsulation layer, and protrudes away from the second substrate, wherein the second encapsulation layer includes a plurality of absorption members for absorbing gas or moisture, and some of the plurality of absorption members are disposed in the at least one protrusion portion of the encapsulation layer, wherein the first substrate includes at least one concave portion recessed into the first substrate in the non-display area, wherein the at least one concave portion of the first substrate includes a plurality of first concave portions each having a polygonal trench pattern, wherein one of the first concave portions shares an edge or a vertex of the polygonal trench pattern with one other of the first concave portions, and wherein the one of the first concave portions is not interlocked with the one other of the first concave portions.

10. The display apparatus of claim 9, wherein the at least one protrusion portion of the encapsulation layer is disposed within the at least one concave portion of the first substrate and has a shape corresponding to a shape of the at least one concave portion of the first substrate.

11. The display apparatus of claim 10, wherein the at least one concave portion of the first substrate further includes at least one second concave portion having a loop shape surrounding the display area.

12. The display apparatus of claim 9, wherein the portion of the first encapsulation layer is disposed on a side surface and a bottom surface of the at least one concave portion of the first substrate.

13. The display apparatus of claim 12, wherein:

the portion of the first encapsulation layer is disposed between the portion of the second encapsulation layer and the side surface and the bottom surface of the at least one concave portion of the first substrate; and the portion of the second encapsulation layer does not directly contact the side surface and the bottom surface of the at least one concave portion of the first substrate.

* * * * *